(12) United States Patent
Armacost et al.

(10) Patent No.: US 6,521,542 B1
(45) Date of Patent: Feb. 18, 2003

(54) METHOD FOR FORMING DUAL DAMASCENE STRUCTURE

(75) Inventors: Mike Armacost, Wallkill, NY (US); Bruno Spuler, Weixdorf (DE); Gabriela Brase, Fishkill, NY (US); Alois Gutmann, Poughkeepsie, NY (US)

(73) Assignees: International Business Machines Corp., Armonk, NY (US); Infineon Technologies AG, Munich (DE)

( * ) Notice: Subject to any disclaimer, the term of this patent is extended or adjusted under 35 U.S.C. 154(b) by 0 days.

(21) Appl. No.: 09/593,739

(22) Filed: Jun. 14, 2000

(51) Int. Cl.[7] ............................................. H01L 21/302
(52) U.S. Cl. ....................................... 438/712; 430/326
(58) Field of Search .............................. 438/712, 717, 438/738, 640, 689, 597, 638; 430/326

(56) References Cited

U.S. PATENT DOCUMENTS

| 5,635,423 A | * | 6/1997 | Huang et al. | 437/195 |
| 5,883,006 A | * | 3/1999 | Iba | 438/712 |
| 5,985,524 A | * | 11/1999 | Allen et al. | 430/326 |
| 6,057,239 A | * | 5/2000 | Wang et al. | 438/689 |
| 6,107,177 A | * | 8/2000 | Lu et al. | 438/597 |
| 6,153,514 A | * | 11/2000 | Wang et al. | 438/640 |
| 6,156,640 A | * | 12/2000 | Tsai et al. | 438/636 |
| 6,297,168 B1 | * | 10/2001 | Shieh et al. | 438/723 |
| 6,300,235 B1 | * | 10/2001 | Feldner et al. | 438/618 |
| 6,300,672 B1 | * | 10/2001 | Lee | 257/641 |
| 6,365,529 B1 | * | 4/2002 | Hussein et al. | 438/780 |

* cited by examiner

Primary Examiner—David Nelms
Assistant Examiner—David Vu
(74) Attorney, Agent, or Firm—Daly, Crowley & Mofford, LLP (57) ABSTRACT

A method is provided for forming a step in a layer of material. The method includes forming the layer over a substrate. A cavity is formed in a portion of an upper surface of the layer. The formed cavity is filled with a filler material to provide a substantially planar surface over the substrate. A photoresist layer is formed over the substantially planar surface over the substrate. An aperture is formed in the photoresist layer in registration with the formed cavity. The aperture exposes a portion of the filler material. The exposed portion of the filler material is removed along with a contiguous portion of the layer to form the step in the indentation. The cavity may be either a trench or a via. A "Trench First" approach and a "Via First" approach are described.

20 Claims, 9 Drawing Sheets

METHOD FOR FORMING DUAL DAMASCENE STRUCTURE

BACKGROUND OF THE INVENTION

This invention relates to semiconductor structures and methods for forming such structures and more particularly to structures having dual damascene recesses formed therein.

As is known in the art, one method for forming interconnects in a semiconductor structure is a so-called dual damascene process. A dual damascene process starts with the deposition of a dielectric layer, typically an oxide layer, disposed over circuitry formed in a single crystal body, for example silicon. The oxide layer is etched to form a trench having a pattern corresponding to a pattern of vias and wires for interconnection of elements of the circuitry. Vias are openings in the oxide through which different layers of the structure are electrically interconnected, and the pattern of the wires is defined by trenches in the oxide. Then, metal is deposited to fill the openings in the oxide layer. Subsequently, excess metal is removed by polishing. The process is repeated as many times as necessary to form the required interconnections. Thus, a dual damascene structure has a trench in an upper portion of a dielectric layer and a via terminating at the bottom of bottom of the trench and passing through a lower portion of the dielectric layer. The structure has a step between the bottom of the trench and a sidewall of the via, at the bottom of the trench.

Two approaches exist for a dual damascene metallization. In the standard approach, i.e., a "via first" approach, the vias are etched into the oxide first, before the trenches are formed. Both types of openings (i.e., the vias and the trenches) are typically formed by using an anisotropic, or dry etch, such as a reactive ion etch (RIE). A disadvantage of this sequence is that the subsequent trench RIE produces oxide fences at the trench/via interface. These fences have the shape of upright rails. The fences are formed because of the use of an anti-reflective coating (ARC) required for deep ultraviolet (DUV) lithography of trenches with use of polymerizing oxide trench etch. The ARC is necessary to control reflectivity variations caused by the topography from previous processing. The ARC is also required as a protection against RIE attack of underlying films. Since the ARC and photoresist polymers adhere to the bottom of the via opening during the trench lithography step, these polymers act as a mask during the etching of the oxide in the trench formation step, creating fences if the oxide etch is too selective to the ARC. One can also use an oxide etch process with lesser selectivity to polymers, but this leads to critical dimension (CD) loss. The fences are not easily covered by subsequent metallization layers, which causes problems with liner and metal fill instability. Therefore, fences are often responsible for yield degradation in a dual damascene metallization fabricated with the "via first" approach. More specifically, fences reduce reliability due to electromigration of metal, with early failure of metal lines. This electromigration is induced by metal not completely covering the fences, thereby creating breaks in the metal. Deposition of the metal by chemical vapor deposition (CVD) can prevent these breaks. However, the latter is undesirable because of the expense entailed. As an alternative to photoresist, hard mask lithography/etch can be used for trench definition to avoid fence formation. This is a rather complex process and has its own, unsolved challenges.

In the second approach, i.e. a "trench first" approach, the trenches are formed before the vias. Here, via lithography is a major challenge, because the vias have to be printed into the topology of the trenches. Reflection from the sidewalls of the trenches makes it difficult to accurately define the vias. Also, the trenches make it difficult to evenly spin on ARC and photoresist. The resist thickness varies, depending on the trench topology. Therefore, the lithographic definition of the vias is done with a non-uniform photoresist thickness, resulting in a very small process window. For optimal planarization of the resist, white space fill is needed. White space fill is a dummy structure whose sole purpose is to improve photoresist thickness uniformity by preventing the photoresist from being thinned too much by being stretched too far between device features. White space fill has the disadvantage of reducing the real estate available for device formation, thereby creating design constraints.

Further, in the "trench first" approach, ARC cannot readily be used for via definition with a standard lithography scheme. Because ARC provides non-conformal coverage over the corners of the trench, extremely high resist selectivity would be required during the via etch. Failure to obtain high resist selectivity results in critical dimension (CD) loss and device failure. For satisfactory printing of sub-0.5 Tm via patterns without ARC, one needs to use DUV technology with an advanced DUV stepper. An example of such a stepper is the commercially available Micrascan lll (manufactured by Silicon Valley Group, San Jose, Calif. 95110). With this procedure, however, the process window of the via lithography becomes very narrow in terms of DUV parameters. The thickness of the resist varies depending on trench topology. Therefore, across any wafer, there exists a range of optimal focus/exposure conditions. Since only one condition can be chosen, this creates a very small process window, as the focus range for successful via exposure is smaller than that allowed within a manufacturing process. Further, the extendability of the approach to via diameters of less than 250 nm is uncertain, because even with advanced stepper tools, performance of the via lithography is threatened by notching of features or scumming of trenches due to challenges presented by the topology with trenches.

SUMMARY OF THE INVENTION

In accordance with the present invention, a method is provided for forming a step in a layer of material. The method includes forming the layer over a substrate. A cavity is formed in a portion of a surface of the layer. The cavity can be either a via or a trench. The formed cavity is filled with a filler material to provide a substantially planar surface over the substrate. The filler material has anti-reflective properties and therefore can also be used for those lithographic processes that require anti-reflective coating prior to photoresist application. A photoresist layer is formed over the substantially planar surface over the substrate. An aperture is formed in the photoresist layer in registration with the formed cavity. The aperture exposes a portion of the filler material. The exposed portion of the filler material is removed along with a contiguous portion of the layer to form the step in the layer. The step has a portion substantially perpendicular to the surface of the layer and a portion substantially parallel to the surface of the layer. The portion substantially parallel to the surface of the layer terminates at a sidewall of the cavity.

In one embodiment of the invention, a trench is formed in a layer of material with a via passing through the layer. The via is disposed at a bottom surface portion of the trench. The method includes forming the layer over a substrate. A first opening is formed in a portion of a surface of the layer. The first opening is filled with a filler material. A photoresist layer is formed over the filler material, filling the first opening, and over a contiguous portion of the surface of the layer. An aperture is formed in the photoresist layer in registration with the formed first opening. The aperture exposes a portion of the filler material. The exposed portion of the filler material is removed along with a contiguous portion of the layer to form a second opening.

In one embodiment the first opening is a trench and the second opening is a via, and in another embodiment the first opening is a via and the second opening is a trench.

In accordance with another embodiment of the invention, a method is provided for forming a trench in a layer of material with a via passing through the layer. The via is disposed at a bottom surface portion of the trench. The method includes forming the layer over a substrate. The via is formed in a portion of a surface of the layer. The formed via is filled with a filler material. A photoresist layer is formed over the filler material and over a contiguous portion of the surface of the layer. An aperture is formed in the photoresist layer in registration with the formed via. The aperture exposes a portion of the filler material. The exposed portion of the filler material and a contiguous portion of the layer are removed to form the trench.

In accordance with still another embodiment of the invention, a method is provided for forming a trench in a layer of material with a via passing through the layer, such via being disposed at a bottom surface portion of the trench. The method includes forming the layer over a substrate. The trench is formed in a portion of a surface of the layer. The formed trench is filled with a filler material. A photoresist layer is formed over the filler material and over a contiguous portion of the surface of the layer. An aperture is formed in the photoresist layer in registration with the formed trench, such aperture exposing a portion of the filler material. The exposed portion of the filler material and contiguous portion of the layer are removed to form the via in a bottom surface portion of the trench.

This process allows a much wider process window for DUV lithography, even on conventional DUV steppers, by expanding the focus/exposure window of exposing vias into topology. The process is extendable to <0.25 Tm. The process requires a DUV resist with a high selectivity to standard polymer etch processes, such as ARC RIE or resist recess. Currently these properties are offered by a variety of multi-layer systems, including CARL (developed by Siemens AG, Munich, Germany, available from Clariant GmbH, AZ Electronic Materials, Wiesbaden, Germany) and ERIS bilayer systems (manufactured by JSR Microelectronics, Sunnyvale, Calif.). These DUV bilayer resist systems have a Si methacrylate top layer and a phenolic-based planarizing bottom layer polymer. Therefore an etch selectivity of resist top layer/bottom layer polymer comparable to that of polysilicon/polymer is expected. For example, using an $O_2$ or $SO_2$ chemistry mentioned below allows one to obtain selectivities of >20:1.

Further, by using Siemens CARL resist, one eliminates the need for using an ARC, because CARL resist has anti-reflective properties. The use of this filler material provides an advantage over conventional lithography where ARC thickness is typically limited to 1000 Å, because one cannot spin the material to a greater thickness. Therefore, conventional ARC materials cannot provide adequate planarization. Thereby, the first layer of the CARL resist provides advantages of both planarization and anti-reflection.

DESCRIPTION OF THE PREFERRED EMBODIMENTS

Trench First Approach

Figure 1:
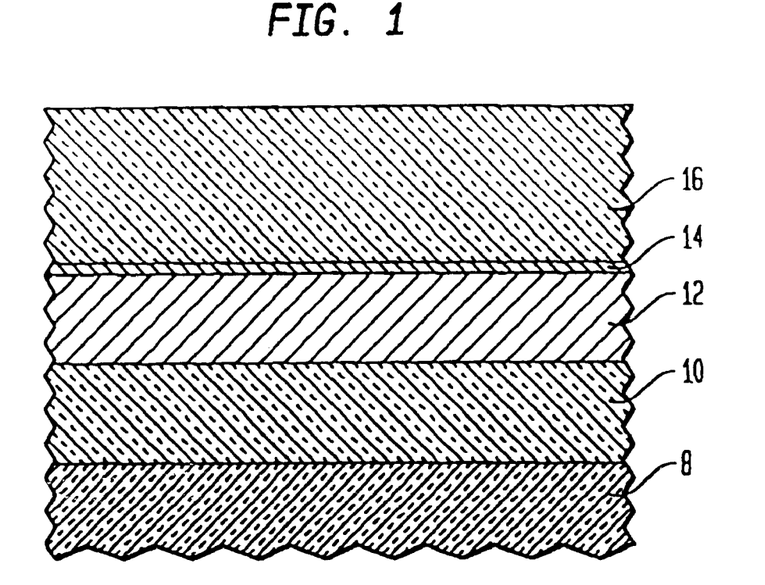
FIG. 1 is a cross-sectional view of a semiconductor structure at an early stage in the processing thereof.

Referring to FIG. 1, a silicon substrate 8 is provided with an oxide layer 10. In accordance with a Damascene process, a metal layer 12, e.g. copper, is deposited over the oxide layer 10, according to methods well-known to those skilled in the art. A portion of the metal layer 12 is removed to define interconnect lines. A silicon nitride ($Si_3N_4$) layer 14 is deposited over the substrate, including over the oxide 10 and metal 12, to act as an etch stop for subsequent processing and to protect the metal 12 from oxidation. An interlevel dielectric layer 16 is deposited over the nitride 14, according to methods well-known to those skilled in the art. For example, the dielectric 16 can be a silicon dioxide layer deposited by CVD. Depending on the application, this layer 16 can be e.g. 1.0 Tm thick.

Figure 2:
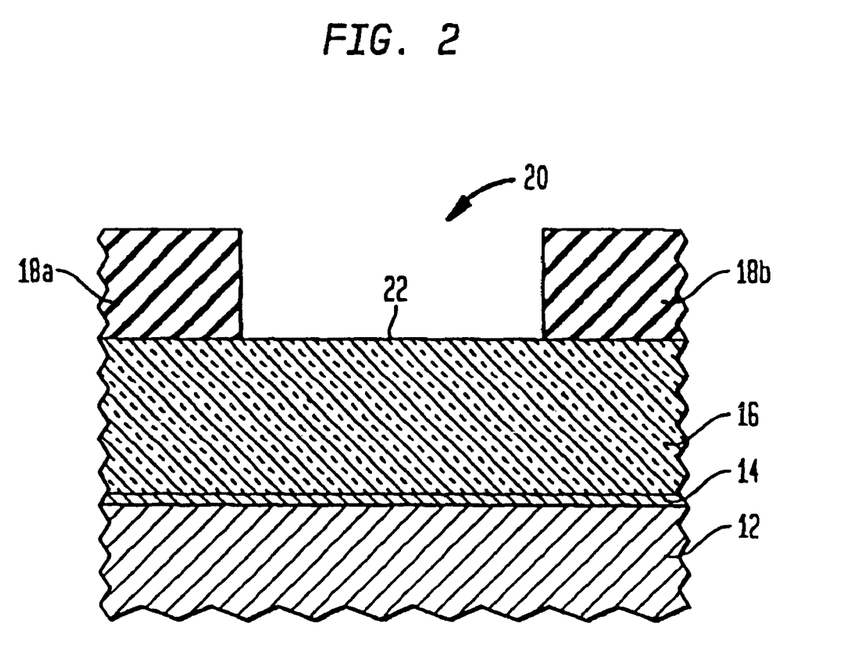
FIGS. 2 through 10 are cross-sectional views of the semiconductor structure of FIG. 1 at subsequent stages in the fabrication thereof in accordance with one embodiment of the invention.

Referring to FIG. 2, a photoresist layer 18a and 18b is spun on to dielectric layer 16. The photoresist layer 18a and 18b is, for example, a standard deep UV resist system, with an ARC such as AR3 (manufactured by Shipley, Marlborough, Mass.), or DUV 30 (manufactured by Brewer Science, Rolla, Mo.) and a photoresist such as JSR resist (manufactured by JSR Microelectronics, Sunnyvale, Calif.). An aperture 20 is formed in the photoresist 18a and 18b, exposing a portion 22 of the dielectric layer 16.

Figure 3:
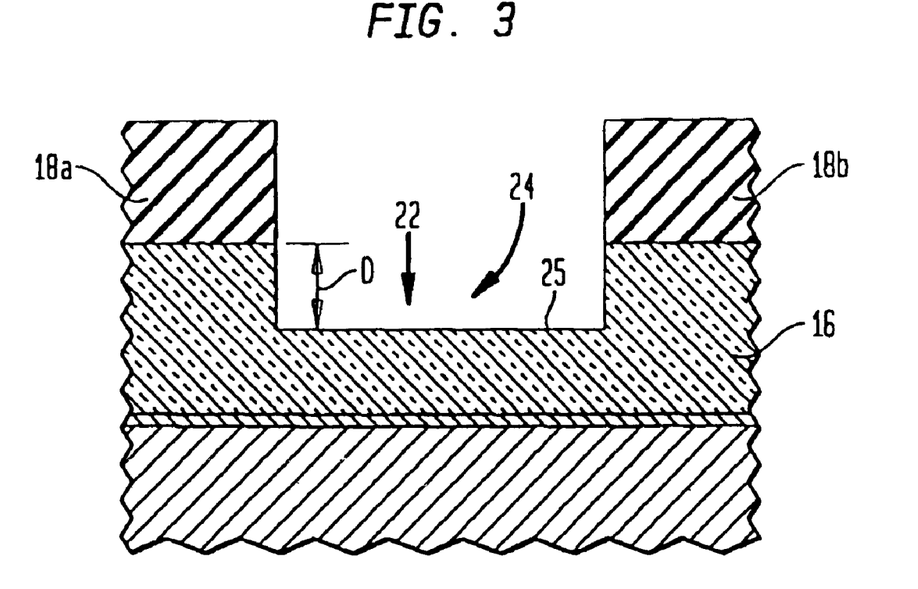

Referring to FIG. 3, a trench 24 with a bottom surface portion 25 is formed in the portion 22 of dielectric layer 16. The trench 24 is formed, for example, by a dry etch using an Applied Materials MXP system (manufactured by Applied Materials, Inc., Santa Clara, Calif.) or a Lam XL system (manufactured by Lam Research Corporation, Fremont, Calif.). One can use standard processes available from the manufacturers of the etching equipment. Trench 24 has a depth $D_1$ of 0.4 Tm.

Figure 4:
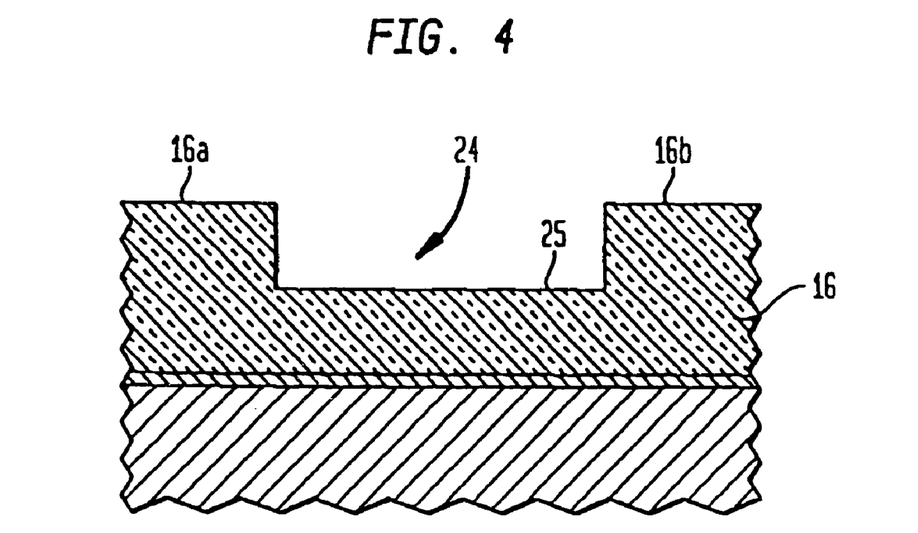

Referring also to FIG. 4, after trench 24 is formed, photoresist 18a and 18b is removed. This can be achieved by dry stripping the photoresist 18a and 18b in a stripper such as an ASPEN ICP (Inductively Coupled Plasma) or Performance Enhancement Platform (PEP) system (manufactured by Mattson Technology Inc., Fremont, Calif. and Gasonics, San Jose, Calif., respectively). Trench 24 is a cavity in layer 16, flanked by contiguous portions 16a and 16b of layer 16.

Figure 5:
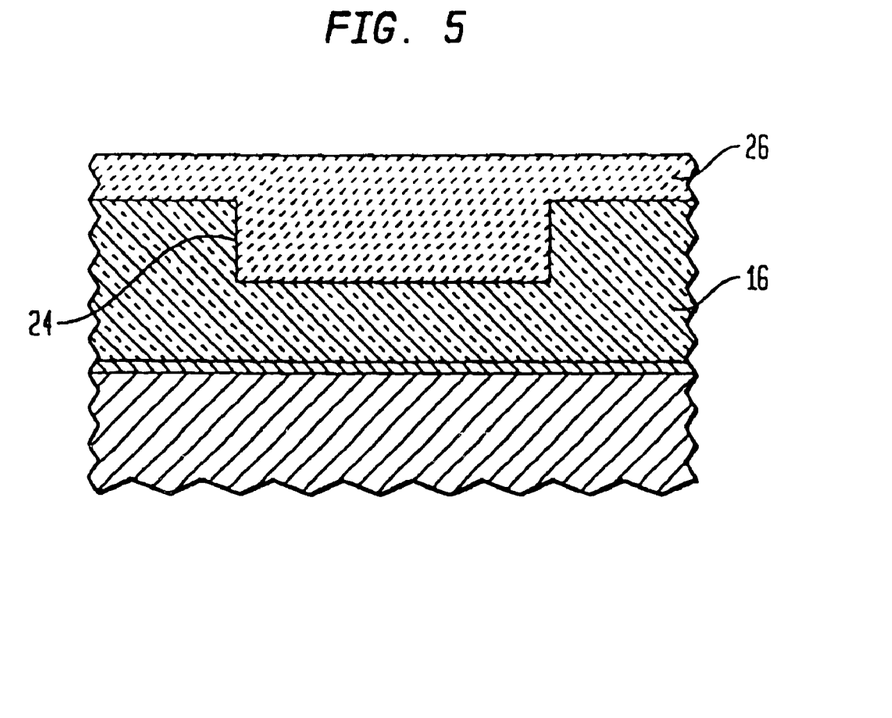

Referring to FIG. 5, a filler material 26 is spun over the interlevel dielectric layer 16, filling trench 24. Filler material 26 is a highly viscous polymer capable of planarizing topology. An appropriate material to use as filler material 26 is a first layer of the CARL bilayer resist system, having a bottom layer of CBC-248 (developed by Siemens AG, Munich, Germany, available from Clariant GmbH, AZ Electronic Materials, Wiesbaden, Germany). In the illustrated embodiment, filler material 26 is spun on to an appropriate thickness, depending on the depth of the topology, until full planarization is achieved; Siemens CARL resist can even be spun to a thickness of 2 Tm. After the top layer of resist is deposited, the resist is cured. Other types of bi-layer resist systems requiring a silylation step can also be used, such as ERIS (Enhanced Integrated Resist Imaging System), a 248 nm system developed by IBM and manufactured by JSR Microelectronics.

Figure 6:
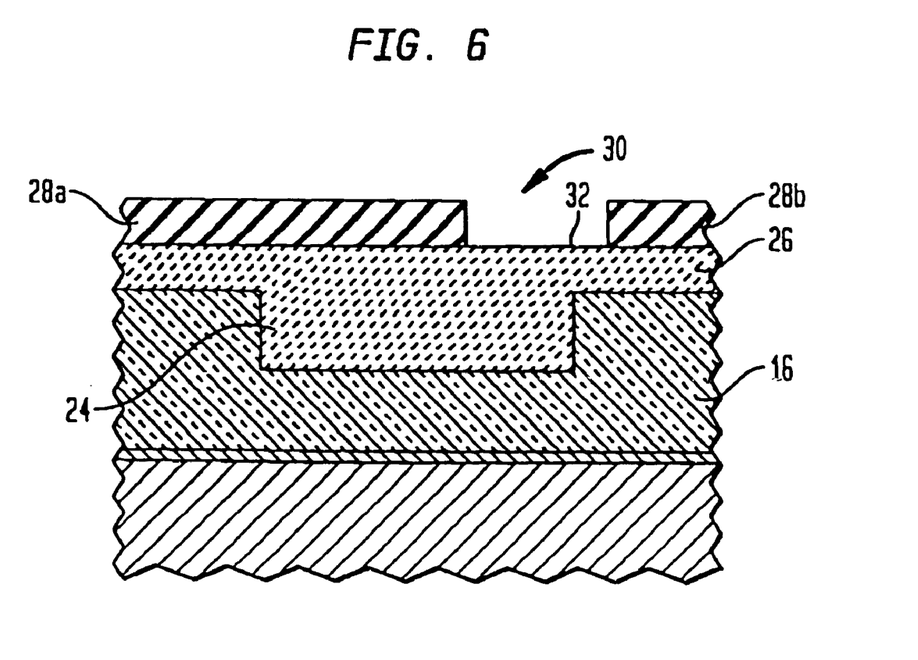

Referring to FIG. 6, a top layer of photoresist is spun on over the filler material 26 and contiguous layer portions 16a and 16b, and patterned to form photoresist segments 28a and 28b. The photoresist can be a polymer such as a top layer of the Siemens CARL resist (CP-248-CA). The photoresist is exposed using a standard DUV 248 nm stepper (not shown). Exposed portions of the photoresist are removed, forming photoresist segments 28a and 28b and openings such as aperture 30. Aperture 30 is formed in registration with trench 24. Aperture 30 exposes a portion 32 of filler material 26. Photoresist 28a and 28b then undergoes a chemical, amplification process with silane chemistry, for example CS-248-Hex developed by Siemens (available from Clariant GmbH, AZ Electronic Materials, Wiesbaden, Germany). Thus, photoresist 28a and 28b is silylated, thereby hardening and becoming a hard mask.

Figure 7:
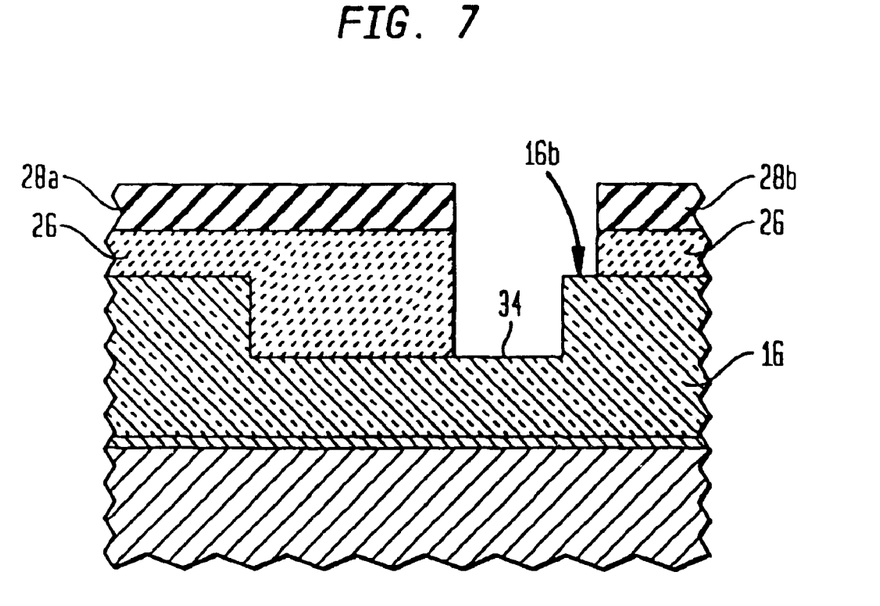

Referring also to FIG. 7, exposed portion 32 of filler material 26 is etched away in a transition etch. This transition etch can be a dry etch in an inductively-coupled tool, such as LAM TCP or Applied Materials IPS. In a Lam TCP reactor, one could use process parameters of top power—260 W; bias—80 W; pressure—10 mTorr; $SO_2$ flow—20 sccm; $O_2$ flow—40 sccm; electrode temperature—$10^7$C. In an IPS system, parameters could include outer power—500 W; inner power—100 W; $O_2$—30 sccm; $SO_2$—50 sccm; pressure—10 mTor available at very low pressures in inductively-coupled tools allow one to etch filler material 26 anisotropically. After the transition etch is complete, a portion 34 of interlevel dielectric 16 is exposed.

Figure 8:
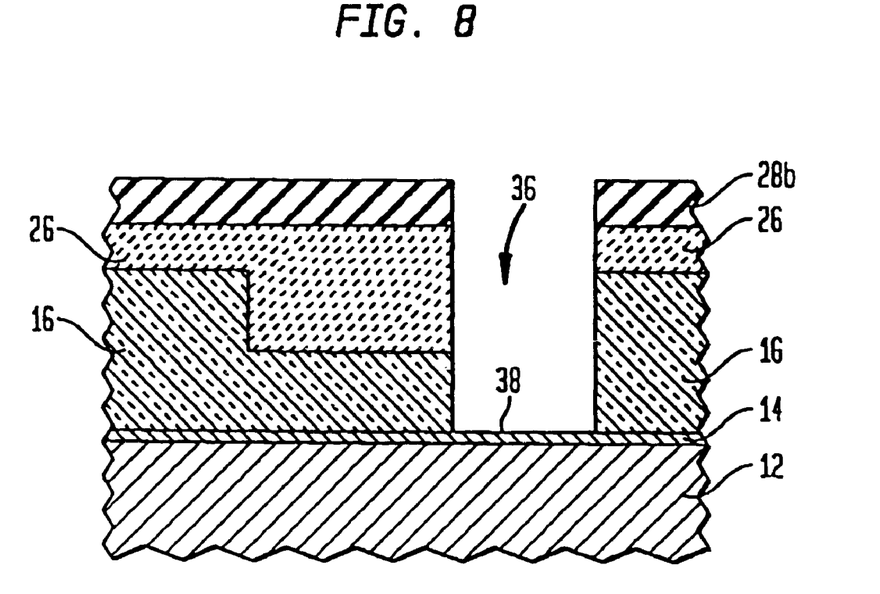

Referring also to FIG. 8, exposed portion 34 of interlevel dielectric 16 and contiguous portion 16b are removed with a dry etch, to form a via 36. A bottom portion 38 of via 36 is defined by nitride layer 14. To form via 36, interlevel dielectric 16 can be etched according to methods well-known to those skilled in the art. It is noted that one can etch interlevel dielectric 16 in the same tool as that used for the transition etch of filler material 26, for example with the AMAT IPS system. Parameters could include outer power—2000 W; inner power—400 W; Ar—300 sccm; $C_4F_8$—13 sccm; $C_2F_6$—17 sccm; pressure—40 mTorr; bias—80 W; roof—$185^7$C.

Figure 9:
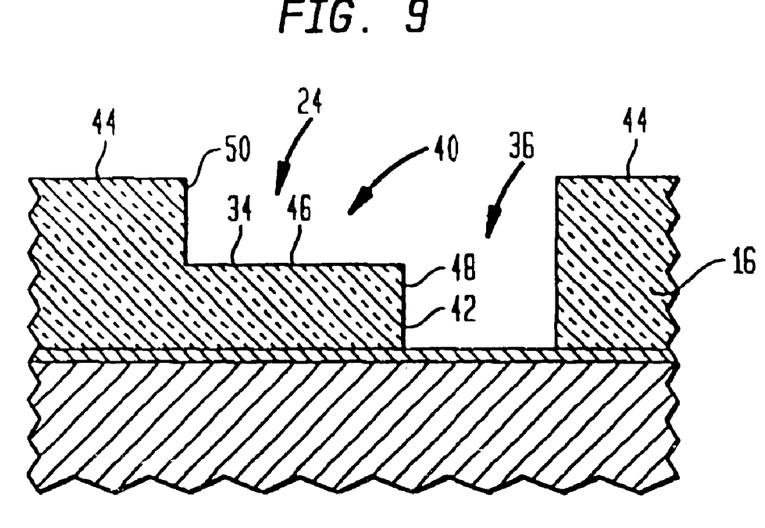

Referring also to FIG. 9, photoresist 28a and 28b can be removed during the etch of the via 36 through the interlevel dielectric 16. Alternatively, photoresist 28a and 28b can be stripped in a separate step, preferably prior to etching the nitride barrier 14. Strip conditions on the IPS can be:

Step 1: $O_2$—500 sccm; outer source coil—2400 W; inner source coil—800 W; pressure—60 mTorr; chuck—500 W; bias—150 W; duration—10 seconds Step 2: $O_2$—500 sccm; outer source coil—2400 W; inner source coil—80 W;

pressure—60 mTorr; chuck—500 W; bias—0 W; duration—60 seconds

After via 36 is etched and photoresist 28a and 28b is stripped, filler material 26 is removed. Filler material 26 can be stripped in a standard process, for example in the same tool in which the resist 18a and 18b for the trench etch was stripped. In the structure resulting from the process, shown in FIG. 9, via 36 is formed in bottom surface portion 34 of trench 24. Trench 24 and via 36 define a step 40 in oxide layer 16. Step 40 has a portion 42 substantially perpendicular to a surface 44a and 44b of layer 16. Step 40 also has a portion 46 substantially parallel to surface 44a and 44b. Portion 46 terminates at a sidewall 48 of via 36 and a sidewall 50 of trench 24.

Figure 10:
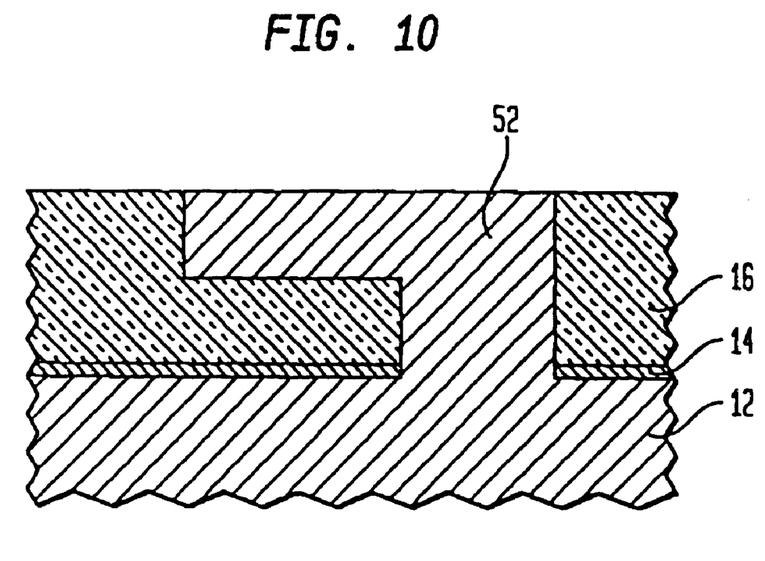

Referring also to FIG. 10, nitride layer 14 at bottom portion 38 of via 36 is removed by a dry etch. A metal 50 is deposited by CVD over substrate 10, thereby filling via 36 and trench 24 and covering dielectric 16. Metal 50 is polished by chemical mechanical polishing (CMP) until dielectric 16 is exposed. Metal 50 provides a conductive connection to underlying metal line 12. This dual damascene process is repeated as many times as required.

Via First Approach

As an alternative to the process described above in which the trench 24 is formed before the via 36, a via can be formed before a trench. In the "via first" approach, an etched via is filled with polymer before the trench lithography step. Then, a nonselective oxide/polymer RIE process can be used to etch the trench without producing fences or causing CD loss. After the trench etch, the rest of the polymer in the via hole is removed by a conventional strip process. This dual damascene approach has the advantage that the bottom of the via is protected by the polymer until the end of the trench etch. Then, it is removed by an isotropic, less surface-damaging strip process.

Figure 11:
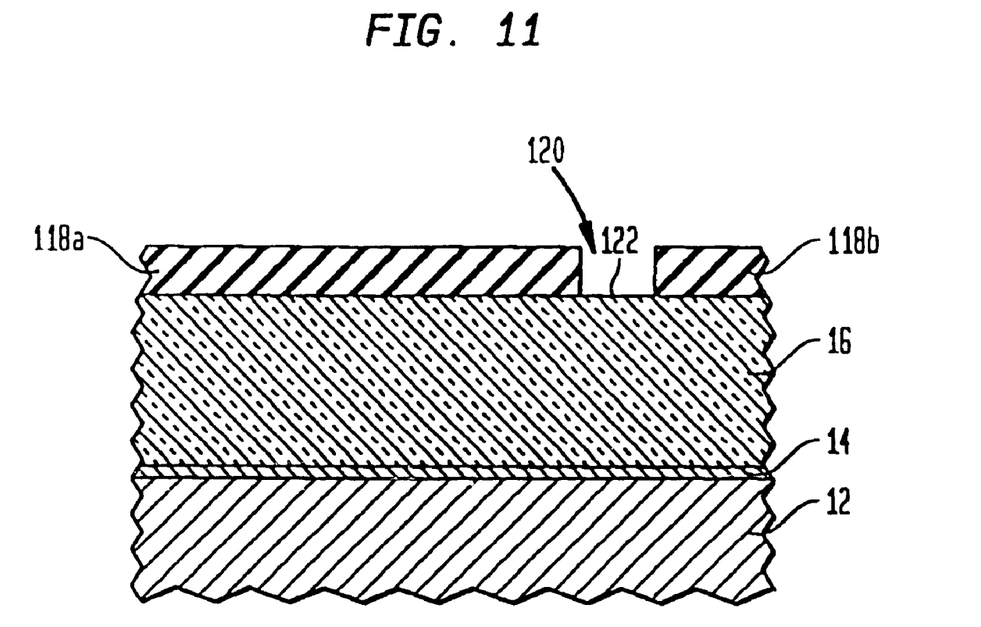
FIGS. 11 through 18 are cross-sectional views of the semiconductor structure of FIG. 1 at subsequent stages in the fabrication thereof in accordance with another embodiment of the invention.

Referring to FIG. 6, a top layer of photoresist is spun on over the filler material 26 and patterned to form photoresist segments 28a and 28b. The photoresist can be a polymer such as a top layer of the Siemens CARL resist (CP-248-CA). The photoresist is exposed using a standard DUV 248 nm stepper (not shown). Exposed portions of the photoresist are removed, forming photoresist segments 28a and 28b and openings such as aperture 30. Aperture 30 is formed in registration with trench 24. Aperture 30 exposes a portion 32 of filler m More specifically, referring to FIG. 11, a photoresist layer is placed on the interdielectric layer 16 of FIG. 1. A deep UV resist can be used such as UVII, manufactured by Shipley. Photoresist segments 118a and 18b are defined, and an opening 120 is formed in the photoresist layer between photoresist segments 118a and 118b by standard photolithographic methods. Opening 120 exposes a portion 122 of a surface of the interlevel dielectric 16.

Figure 12:
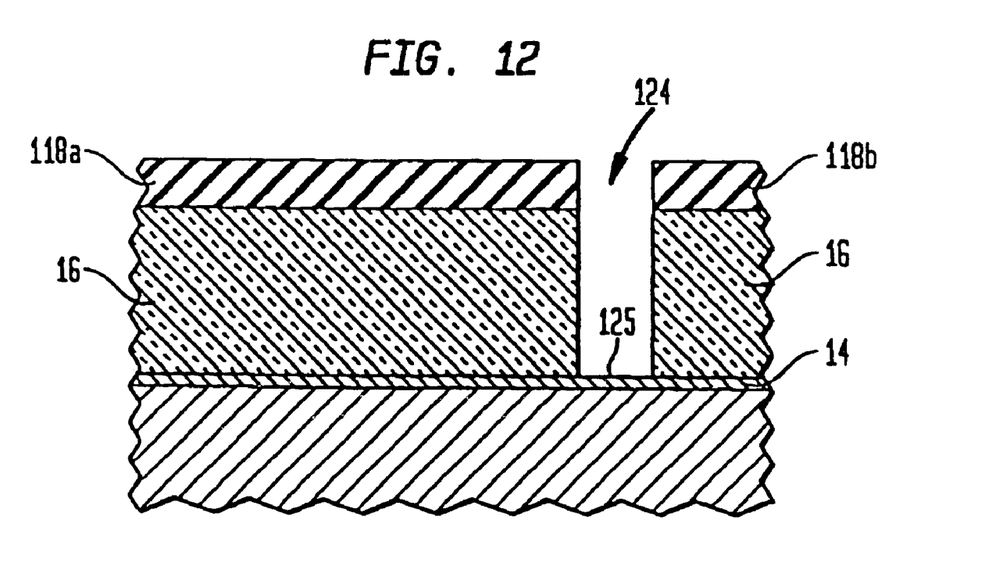

Referring also to FIG. 12, via 124 is formed by removing portion 122 of interlevel dielectric 16. This removal can be done by dry etching, for example in an IPS reactor, with the same parameters as given for the Trench First Approach. The etching of via 124 ends upon exposure of a portion 125 of nitride 14.

Figure 13:
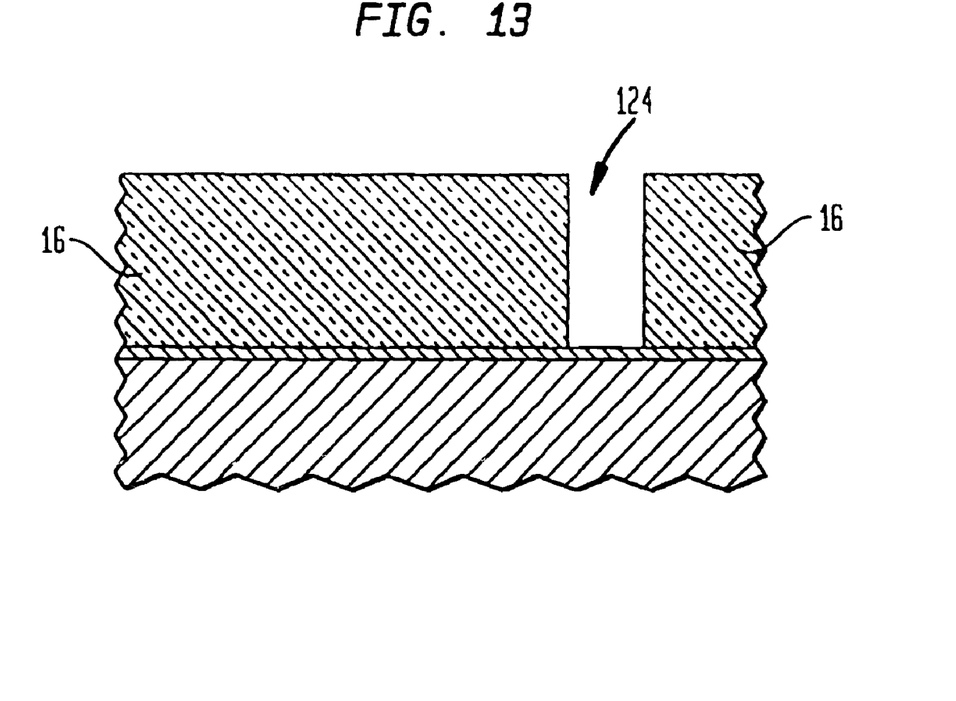

Referring also to FIG. 13, photoresist 118a and 118b is removed, by using a Mattson ICP or Gasonics PEP system with conventional strip parameters.

Figure 14:
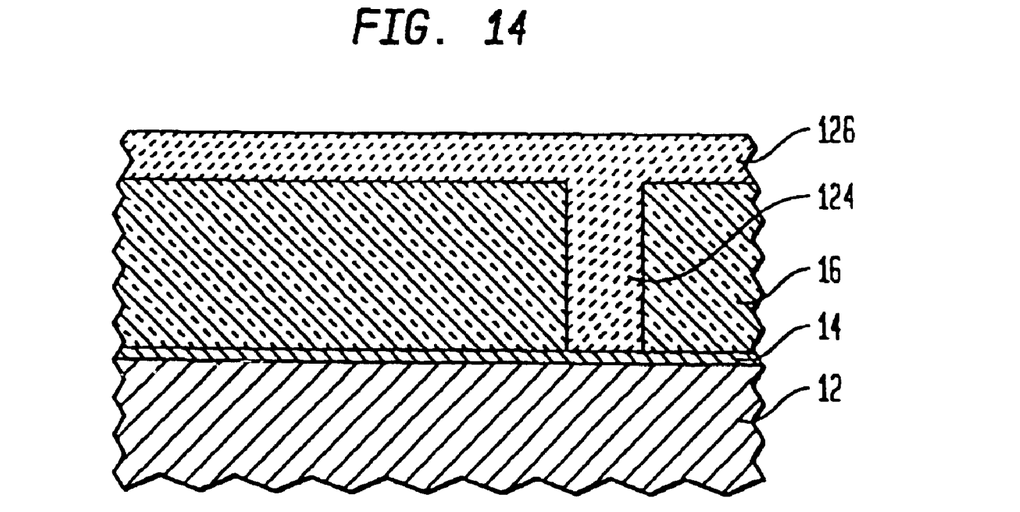

Referring to FIG. 14, filler material 126 is spun on to interlevel dielectric layer 16. Filler material 126 fills via 124. The filler material is phenolic-based resist which is compatible with silylate resists. It can be spun on using a standard lithographic track available from Tokyo Electron Limited (TEL), Yamanashi, Japan or from Silicon Valley Group, San Jose, Calif. An appropriate material to use as filler material 126 is a highly viscous polymer capable of planarizing topology. An example of such a material is a first layer of CARL resist. The via and subsequent trench etches must not etch through the nitride layer 14, in order to protect the metal 12 underneath. When the via 124 is etched first, the nitride layer 14 is reached. Filler material 126 provides a protective layer which shields the nitride layer 14 from being attacked during a subsequent trench etch.

Figure 15:
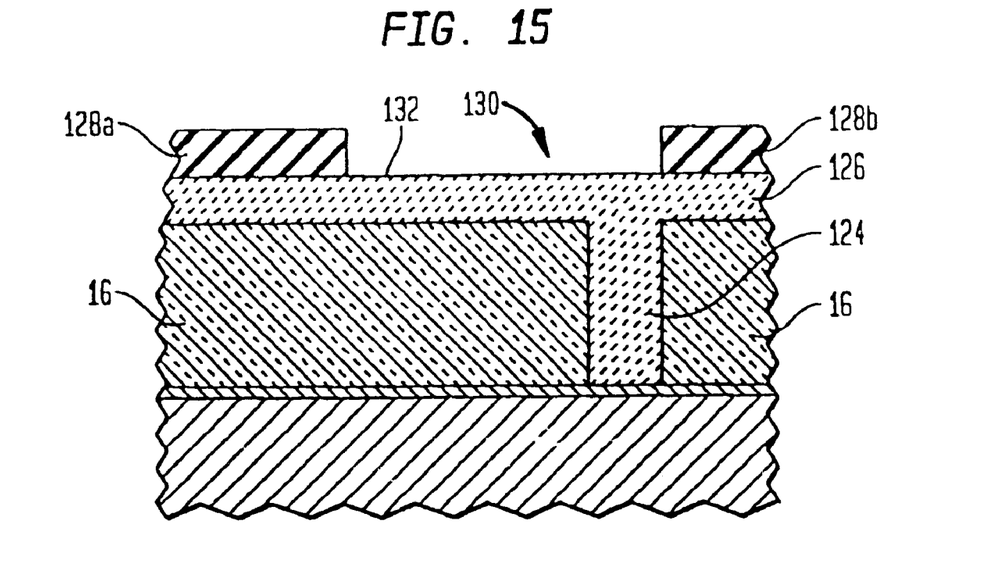

Referring to FIG. 15, a photoresist layer is spun on to filler material 126. A suitable photoresist for this process is the top layer of the Siemens CARL bilayer resist system. The photoresist is exposed as detailed above. Subsequent to exposure, photoresist segments 128a and 128b are defined, and an aperture 130 is formed in registration with via 124. Aperture 130 exposes a portion 132 of filler material 126. Photoresist 128a and 128b then undergoes a chemical amplification process with silane chemistry as detailed above. Thus, photoresist 128a and 128b is silylated, thereby hardening and becoming a hard mask.

Figure 16:
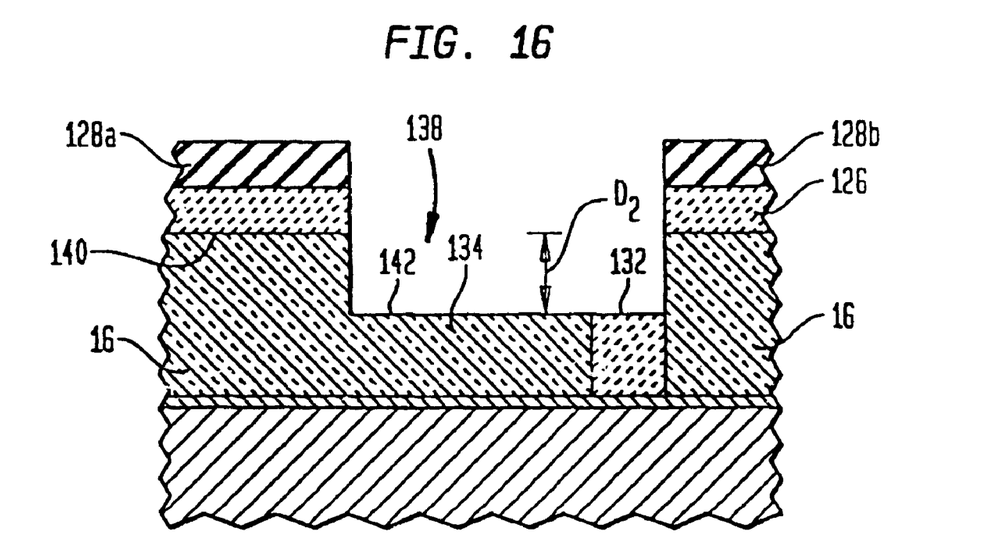

Referring also to FIG. 16, exposed portion 132 of filler material 126 is etched back, for example on a Lam TCP with parameters of e.g. pressure—80 mTorr; power—1000 W; Ar—450 sccm; $CF_4$—60 sccm. Once exposed portion 132 of filler material 126 is etched back sufficiently, it will expose a portion 134 of interlevel dielectric 16, contiguous to via 124. Then, exposed filler material portion 132 and interlevel dielectric portion 134 are etched back simultaneously to form trench 138. The etch rate of the filler material 126 is substantially the same as that of the interlevel dielectric 134. Trench 138 has a depth $D_2$ of 0.5 Tm from an upper surface 140 of interlevel dielectric 16 to a bottom portion 142 of trench 138. Photoresist 128a and 128b is removed during the trench etch. Alternatively, photoresist 128a and 128b is removed in a subsequent conventional strip process.

Figure 17:
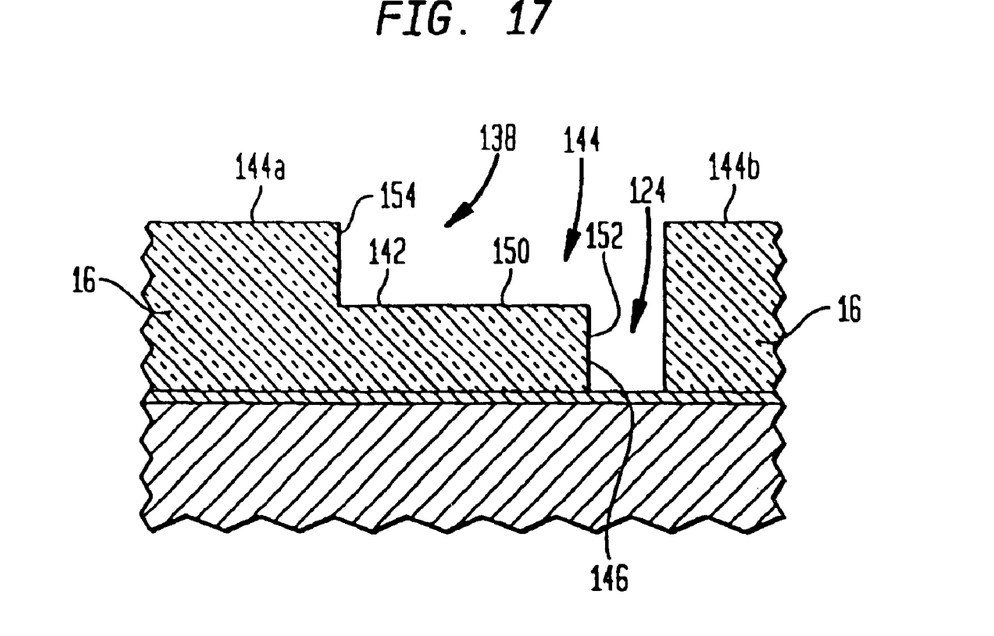

Referring also to FIG. 17, filler material 126 is completely removed during the resist strip. The resulting structure has via 124 passing through interdielectric layer 16. Via 124 is disposed at a bottom surface 142 of trench 138. Via 124 and trench 138 define a step 144 in oxide layer 16. Step 144 has a portion 146 substantially perpendicular to a surface 148a and 148b of layer 16. Step 144 also has a portion 150 substantially parallel to surface 44a and 44b. Portion 150 terminates at a sidewall 152 of via 124 and a sidewall 154 of trench 138.

Figure 18:
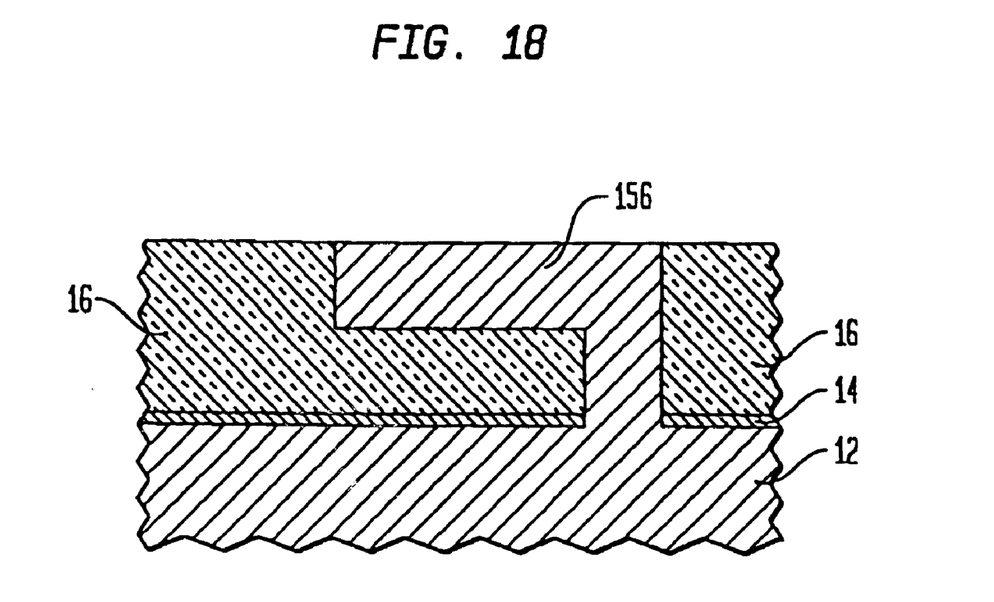

Referring also to FIG. 18, nitride layer 14 at bottom portion 38 of via 36 is removed with a dry etch. A metal 156 is deposited by CVD over substrate 10, thereby filling via 124 and trench 138 and covering dielectric 16. Metal 154 is polished by CMP until dielectric 16 is exposed. Metal 156 provides a conductive connection to underlying metal line 12. This dual damascene process is repeated as many times as required. Many additional embodiments are possible. Other embodiments are within the spirit and scope of the appended claims.

What is claimed:

1. A method for forming a step in a layer of material, such method comprising:

forming the layer over a substrate;

forming a cavity in a portion of an upper surface of the layer;

filling the formed cavity with a bi-layer antireflective coating and planarization, filler material to provide a substantially planar surface over the substrate;

forming an unexposed photoresist layer comprising a silicon methacrylate top layer disposed over the substantially planar surface over the substrate;

forming an aperture in the photoresist layer in registration with the formed cavity, such aperture exposing a portion of the filler material; and removing the exposed portion of the filter material and contiguous portion of the layer to form the step in the layer and having a portion substantially perpendicular to the surface of the layer and a portion substantially parallel to the surface of the layer and wherein the portion substantially parallel to the surface of the layer terminates at a sidewall of the cavity.

2. The method of claim 1 wherein the filler material has a thickness greater than approximately 1.0 $\mu$m.

3. The method of claim 1 further comprising forming a hard mask using a lane chemistry process wherein the filler material and the photoresist layer have a etch selectivity greater than approximately 20:1.

4. A method for forming two adjacent openings in a layer of material, such method comprising:

forming the layer over a substrate;

forming a first opening in a portion of a surface of the layer;

filling the formed first opening with a bi-layer antireflective coating and planarization, filler material;

forming an unexposed photoresist layer comprising a silicon methacrylate top layer disposed over the filler material filling the first opening and over a contiguous portion of the surface of the layer;

forming an aperture in the photoresist layer in registration with the formed first opening, such aperture exposing a portion of the filler material; and removing the exposed portion of the filler material and the contiguous portion of the layer to form a second opening in the layer.

5. The method of claim 4, wherein the first opening is a trench and the second opening is a via.

6. The method of claim 4, wherein the first opening is a via and the second opening is a trench.

7. A method for forming a trench in a layer of material with a via passing through the layer, such via being disposed at a bottom surface portion of the trench, such method comprising:

forming the layer over a substrate;

forming the via in a portion of a surface of the layer;

filling the formed via with a bi-layer antireflective coating and planarization, filler material;

forming an unexposed photoresist layer comprising a silicon methacrylate top layer disposed over the filler material and over a contiguous portion of the surface of the layer;

forming an aperture in the photoresist layer in registration with the formed via, such aperture exposing a portion of the filler material; and removing the exposed portion of the filler material and the contiguous portion of the layer to form the trench.

8. The method of claim 7, wherein the filler material is a polymer.

9. The method of claim 7, wherein the filler material has anti-reflective properties.

10. The method of claim 7, wherein filling the via with a filler material includes spinning on the filler material.

11. The method of claim 7, further comprising, after forming the aperture in the photoresist, hardening the photoresist.

12. The method of claim 11, wherein hardening the photoresist includes silylating the photoresist.

13. The method of claim 7, wherein removing a portion of the filler material and the contiguous portion of the layer includes performing an etch.

14. A method for forming a trench in a layer of material with a via passing through the layer, such via being disposed at a bottom surface portion of the trench, such method comprising:

forming the layer over a substrate;

forming the trench in a portion of a surface of the layer;

filling the formed trench with a bi-layer antireflective coating and planarization, filler material;

forming an unexposed photoresist layer comprising a silicon methacrylate top layer disposed over the filler material and over a contiguous portion of the surface of the layer;

forming an aperture in the photoresist layer in registration with the formed trench, such aperture exposing a portion of the filler material; and removing the exposed portion of the filler material and the contiguous portion of the layer to form the via in a bottom surface portion of the trench.

15. The method of claim 14, wherein the filler material is a polymer.

16. The method of claim 14, wherein the filler material has anti-reflective properties.

17. The method of claim 14, wherein filling the trench with a filler material includes spinning on the filler material.

18. The method of claim 14, further comprising, after forming the opening in the photoresist, hardening the photoresist.

19. The method of claim 18, wherein hardening the photoresist includes silylating the photoresist.

20. The method of claim 14, wherein removing the exposed portion of the filler material and the contiguous portion of the layer includes performing an etch.

* * * * *